United States Patent [19]

Villalon

[11] Patent Number: 5,006,485
[45] Date of Patent: Apr. 9, 1991

[54] METHOD OF MANUFACTURING AN INTERGRATED CIRCUIT INCLUDING STEPS FOR FORMING INTERCONNECTIONS BETWEEN PATTERNS FORMED AT DIFFERENT LEVELS

[75] Inventor: Claudine Villalon, Chennevieres, France

[73] Assignee: U.S. Philips Corporation, New York, N.Y.

[21] Appl. No.: 446,506

[22] Filed: Dec. 4, 1989

[30] Foreign Application Priority Data

Dec. 9, 1988 [FR] France ............... 88 16230
Sep. 19, 1989 [FR] France ............... 89 12263

[51] Int. Cl.$^5$ ............ H01L 21/312; H01L 21/47
[52] U.S. Cl. ............... 437/195; 437/228; 437/235; 156/643; 156/653; 156/657; 148/DIG. 43
[58] Field of Search ........ 437/195, 228, 235, 241, 437/243; 156/643, 653, 657; 148/DIG. 43

[56] References Cited

U.S. PATENT DOCUMENTS

| | | | |
|---|---|---|---|
| 4,349,609 | 9/1982 | Takeda et al. | 437/195 |
| 4,518,629 | 5/1985 | Teuch | 437/195 |
| 4,541,169 | 9/1985 | Bartush | 437/187 |
| 4,545,852 | 10/1985 | Barton | 437/228 |
| 4,666,553 | 5/1987 | Blumenfeld et al. | 156/643 |
| 4,671,849 | 6/1987 | Chen et al. | 156/653 |
| 4,676,868 | 6/1987 | Riley et al. | 156/653 |
| 4,692,204 | 9/1987 | Fabien et al. | 156/643 |
| 4,839,311 | 6/1989 | Riley et al. | 437/228 |

FOREIGN PATENT DOCUMENTS 0100166 2/1984 European Pat. Off. .
3443793 6/1986 Fed. Rep. of Germany .

OTHER PUBLICATIONS

Soderman, "Polysilicon Gate FET Process with Substrate Contacts", IBM Tech. Disc. Bul., vol. 21, No. 3, 8/78.

Primary Examiner—Brian E. Hearn
Assistant Examiner—Tuan Nguyen
Attorney, Agent, or Firm—Paul R. Miller

[57] ABSTRACT

A method of manufacturing integrated circuit is set forth in which a plurality of conducting patterns are formed on a substrate and dielectric material is deposited on the surface of the substrate and thereafter etched. The invention involves forming the dielectric material from two separate dielectric layers having respectively formed thicknesses such that upon etching the top dielectric layer is completely removed, while the underlying dielectric layer is removed according to the underlying type of conductive pattern.

14 Claims, 5 Drawing Sheets

METHOD OF MANUFACTURING AN INTERGRATED CIRCUIT INCLUDING STEPS FOR FORMING INTERCONNECTIONS BETWEEN PATTERNS FORMED AT DIFFERENT LEVELS

The invention relates to a method of manufacturing an integrated circuit including the steps of:

a. forming on a substrate so-called first conducting patterns, which comprise first parts $P_1$ having at least a dimension $W_1$ of small value and so-called second parts $P_2$ having larger dimensions and an upper surface substantially coplanar with that of the first parts $P_1$;

b. depositing dielectric material having a thickness smaller on the first parts $P_1$ than on the second parts $P_2$; and c. etching the dielectric material, which step is stopped from the appearance of the upper surface of the first parts $P_1$ in so-called first interconnection regions $R_1$.

The invention is used in the reduction of the surfaces of integrated circuits showing several interconnection levels and in general in the formation of interconnections between patterns disposed at different levels.

The invention is used more particularly in the formation of interconnections between non-planer elements of micron or submicron dimensions.

U.S. Pat. No. 4,621,045 discloses a method of manufacturing an integrated circuit, which includes the step of forming on a substrate conducting interconnection pads of large surface area and conducting pillars of small surface area. This method comprises the step of forming on the device thus formed a layer of a material having the properties both of an electrical insulator and of a planarizing layer. Due to these properties of a planarizing layer, this layer has a thickness smaller on the pillars of small surface area than on the pads of large surface area. This method moreover comprises the step of uniformly etching the dielectric planarizing layer, the etching step being stopped upon the appearance of the upper surface of the pillars.

Due to the fact that the dielectric deposited on the device comprising the large and the small patterns is formed by a single layer, it is necessary that this layer has at least two properties at a time, i.e. that it is a good electrical insulator and is at the same time planarizing.

In fact, when the method is terminated, the upper conducting layer is found to be only insulated from the lower conducting layer by a photoresist layer, which is made insoluble by irradiation, or by a layer of polyimide, i.e. by a layer whose first and essential property is to be planarizing, this layer consisting of a material chosen from materials which are also electrically isolating.

Now it has been found that for the manufacture of integrated circuits of the last generation these properties are not sufficient: the isolating or insulating layer, which separates two conducting layers, must moreover have properties of passivating the semiconductor material covered by it, and properties of mechanical resistance, of temperature resistance when subjected to later steps of forming the integrated circuit and of resistance to ageing.

Nowadays the materials known for their planarizing properties have none of these properties: they are not capable of ensuring the passivation of the semiconductor material if they are directly in contact with the latter; they have a low mechanical resistance, a low temperature resistance (at most 250° C.) and they age rapidly.

The manufacturer of integrated circuits will therefore refuse now to utilize any circuit including an ultimate layer of lacquer or resin. Therefore, the method known from the aforementioned patent document becomes inappropriate due to the fact that it results in a circuit which is no longer in manufacturing synergy with the new integrated circuits.

Therefore, it should be avoided to maintain such a layer among the ultimate layers.

Subsequently, a problem arises in the case in which these circuits are further non-planer. Thus, this state of the art does not indicate the formation of a connection between a pattern of small (micron or submicron) dimensions and another pattern of arbitrary dimensions formed, however, on a lower layer of the circuit, which happens when connections should be formed between, for example, electrodes of different non-planer transistors.

An object of the invention is to provide a method of manufacturing resulting in an integrated circuit without unreliable ultimate layers, such as the isolating layer known from the aforementioned patent, and on the contrary is provided with isolating layers having better electrical and mechanical performances.

Another object of the invention is to provide a method of manufacturing resulting in a circuit, in which the isolating layer, or layers, is, or are, also a passivation layer, or layers.

Another object of the invention is to provide a method which can be used in the manufacture of both planar and non-planar circuits.

Another object of the invention is to provide a method which results in the planarization of the device even if the latter originally was non-planar.

Another object of the invention is to provide a method which permits forming openings without the necessity of using opening masks on all the chosen patterns of a circuit, and in the chosen interconnection regions, irrespective of the original dimension of the pattern on which an opening should be formed and irrespective of the original degree of flatness of the substrate on which it is formed.

Another object of the invention is to provide a method which permits forming openings and hence interconnections directly with patterns of micron or submicron dimensions.

Another object of the invention is to provide a method of manufacturing an integrated circuit in manufacturing energy with the integrated circuits of the last generation.

Another object of the invention is to provide a method which is simple and inexpensive in view of all the advantages offered by it.

According to the invention, these objects are achieved by means of a method of manufacturing an integrated circuit of the kind described in the opening paragraph and characterized in that for this purpose the deposition of the dielectric material comprises the 15 deposition of a first dielectric layer $D_1$ covering the device with a uniform thickness $H_d$ and substantially equal to or larger than the height $H_m$ of the first parts $P_1$ followed by the deposition of a second dielectric layer $D_2$ having a thickness smaller on the first parts $P_1$ than on the second parts $P_2$, and in that the etching of the dielectric material comprises a first step which is stopped upon appearance of the upper surface of the first dielectric layer $D_1$ above the first parts $P_1$ and a second step during which the first dielectric layer $D_1$ is etched at a rate higher than or equal to the rate of etching of the second dielectric layer $D_2$.

An advantage resulting immediately from this method is that, due to the fact that the first dielectric layer $D_1$ is deposited in a uniform thickness, among uniformly deposited materials compounds can be found which are capable of forming appropriate passivation layers.

Another advantage is that among the materials likely to be deposited in a uniform layer $D_1$ materials can be found which have beside the property of passivation better performance of mechanical strength and better performances as an electrical isolator than the isolating layer known from the state of the art, and in general, then the layers deposited in fluid form or as planarization layers.

Another advantage due to the fact that the first dielectric layer $D_1$ is deposited in a uniform thickness is that among the materials capable of being deposited in a uniform thickness materials can be found which not only have the advantages mentioned above, but also are in manufacturing synergy with all the modern integrated circuit technologies and with those which already have been selected to be used in the near future.

Another advantage is that without the use of a mask openings can be provided directly in patterns of micron or sub-micron dimensions.

Another advantage is that a planarization layer $D_2$ of lacquer or resin can be eliminated.

In one embodiment, this method is characterized in that the formation of the first conducting patterns comprises the formation of second parts $P_2$ provided in so-called second interconnection regions $R_2$ with parts of reduced width or appendices $P'_1$ that can assimilate with the first parts $P_1$ having at least one dimension substantially equal to $W_1$ and an upper surface substantially coplanar with that of the first parts $P_1$.

An advantage is that openings can be formed in the second parts $P_2$ of large dimensions without supplementary steps, that is to say during the same step as the step of forming in the parts $P_1$ openings having at least one small dimension substantially equal to $W_1$ and an upper surface substantially coplanar with that of the first parts $P_1$.

An advantage is that openings can be provided in the second parts $P_2$ having large dimensions without supplementary steps, that is to say during the same step as the step of providing openings in the parts $P_1$ which have at least one small dimension and moreover without the use of another mask than that necessary for forming the second parts $P_2$ in the first step of the method.

Another advantage is that the openings both in the first parts $P_1$ and in the parts $P'_1$ of the parts $P_2$ occupy a very limited surface of the circuit.

Another advantage is that as interconnection regions $R_2$ for the second parts $P_2$ regions can be chosen which can be remote from the parts $P_2$ or can be situated in the zones which, without the use of the method, would have been lost, which possibilities offers new possibilities of arranging the design of the circuits, which are profitable for the designer of integrated circuits.

In another embodiment, the method is characterized in that the formation of the first conducting patterns comprises the formation of so-called third parts $P_3$ having arbitrary dimensions and an upper surface at a level below that of the upper surface of the first parts $P_1$ and the formation of conducting lines $L_1$ having so-called contact zones with the third parts $P_3$ on the one hand and in the so-called third interconnection regions $R_3$ on the other hand parts of reduced width or appendices $P''_1$ which assimilate with the first parts $P_1$ having at least one dimension substantially equal to $W_1$ and an upper surface substantially coplanar with that of the first parts $P_1$.

An advantage is that the method can be used both in planar circuits and in non-planar circuits.

Another advantage is that, in order to raise the level of parts $P_3$, it is much easier to form, lines rather than pillars, indicated by the state of the art. In fact, in the formation of the conducting lines $L_1$, the method of masking is not critical.

Another advantage is that the interconnection region $R_3$ can be chosen in favourable zones of the circuit, as has been stated for the choice of the interconnection regions $R_2$.

Another advantage is that all the interconnection regions of the circuit can be brought to the same level, irrespective of the original level of the parts $P_3$, and that the openings can be formed in a single step and without a mask, provided that the parts $P_1$, $P'_1$, $P''_1$ have at least one or only one dimension of smaller value than the other dimensions of the first patterns at this level.

In a further embodiment, the method is characterized in that the thickness $H_d$ of the first dielectric layer $D_1$ is chosen as a function of the height $H_m$ of the first parts $P_1$ and the difference $H_l$ between the first and second thicknesses of the second dielectric layer $D_2$ so as to satisfy the condition:

$$H_d = H_m^2 (H_m - H_l)^{-1},$$

and in that the ratio S between the rate of etching the first dielectric layer $D_1$ and the rate of etching the second dielectric layer $D_2$ in the second etching step is chosen so as to satisfy the condition:

$$S = (H_d - H_m) H_l^{-1} > 1,$$

An advantage is that at the end of the process, the device can be planar, while the material forming the remaining dielectric layer $D_1$ does not form part of the so-called planarization materials.

Another advantage is that, in the case of originally non-planar circuits, the method offers the possibility of obtaining at the end of the last step a device which is nevertheless planar.

In a further embodiment, the method is characterized in that the first parts $P_1$ are patterns of micron or submicron dimensions, for example gates of field effect transistors or emitters of bipolar transistors, and in that the second parts $P_2$ are electrodes of active components or interconnection lines, and in that the third parts $P_3$ are electrodes of non-planar active components, for example bases or collectors of bipolar transistors.

The invention therefore permits the miniaturization of both non-planar and planar circuits, simplification of their manufacture, improvement of their properties and reduction of their manufacturing cost.

In order that the invention may be readily carried out, it will now be described more fully with reference to the accompanying drawings, in which:

FIG. 5c is a sectional view taken on the axis I—I of FIG. 5a.

The method according to the invention is used more particularly for formation of interconnections between metallic patterns ($P_1$, $P'_1$, $P''_1$) disposed at a first level $N_1$ of a circuit by means of the interconnection lines of second patterns $L_2$ formed in a metallic layer separated from the first patterns of the first level $N_1$ by a dielectric layer $D_1$.

The present invention proposes a method which permits forming openings or VIAs in the dielectric layers $D_1$ on the parts $P_1$, $P'_1$, $P''_1$ of the patterns, which have at least one of their dimensions $W_1$ parallel to the first level $N_1$ and with a small value with respect to the values $W_2$ of the other parts $P_2$ of these patterns. These other parts remains covered by the dielectric layer $D_1$, without the use of conventional masks. Such masks are obtained and positioned only with great difficulty and are therefore expensive when carrying out the method.

In one embodiment, the method according to the invention first comprises the following successive step.

Figure 1A:
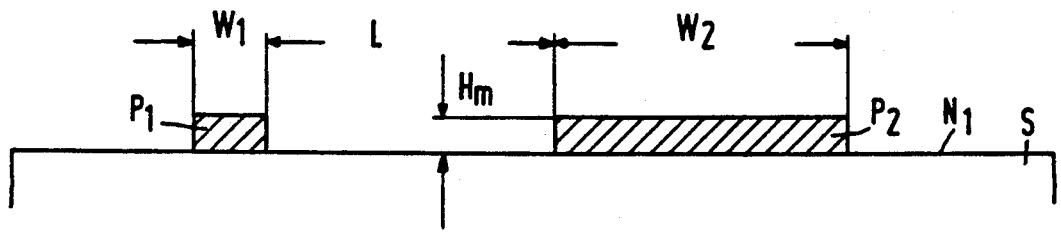
FIGS. 1a, 1b, 1c and 1d show the first steps of the method according to the invention, in the case in which the first patterns comprise coplanar parts $P_1$ and $P_2$.

First is the step of (A) forming, as shown in sectional view in FIG. 1a, at the level $N_1$ of the integrated circuit, metallic or semiconductor patterns having parts $P_1$ and $P_2$.

The first level $N_1$ can be the upper surface of a substrate S of a semiconductor material, such as silicon or gallium arsenide.

The first level may also be a second interconnection level which is already formed. On the other hand, the first parts $P_1$ may consist of a semiconductor material, such as an emitter of a bipolar transistor.

The parts $P_1$ have a height $H_m$. Here only the case is considered in which the parts $P_1$ have a height $H_m$ larger than or substantially equal to the height of the parts $P_2$.

The parts $P_1$ are moreover defined by a lateral dimension $W_1$ and the parts $P_2$ are defined by a lateral dimension $W_2$. The object of the invention is to provide openings or VIAs in the parts $P_1$ in the case in which they have at least one dimension $W_1$ smaller than or approximately equal to half the dimension $W_2$ of the parts $P_2$. In the embodiment shown in FIG. 1a, the first part $P_1$ are is separated from the second part $P_2$ by a distance L. However, this is a particular case. The parts $P_1$ and $P_2$ can be joined together, as shown in FIGS. 6a and 6b.

The materials used to form the conducting patterns having parts $P_1$ and $P_2$ may be any metal usually employed in the manufacture of integrated circuits, such as: AuGe, NiCr, TiPtAu or $W_n$. If the gate of a (field effect or bipolar) transistor is concerned; these materials may also be aluminium or polysilicon. If interconnection lines are concerned; these materials may also be any semiconductor.

The heights $H_m$ can lie in the range of from a few hundred nms to several microns.

Figure 6A:
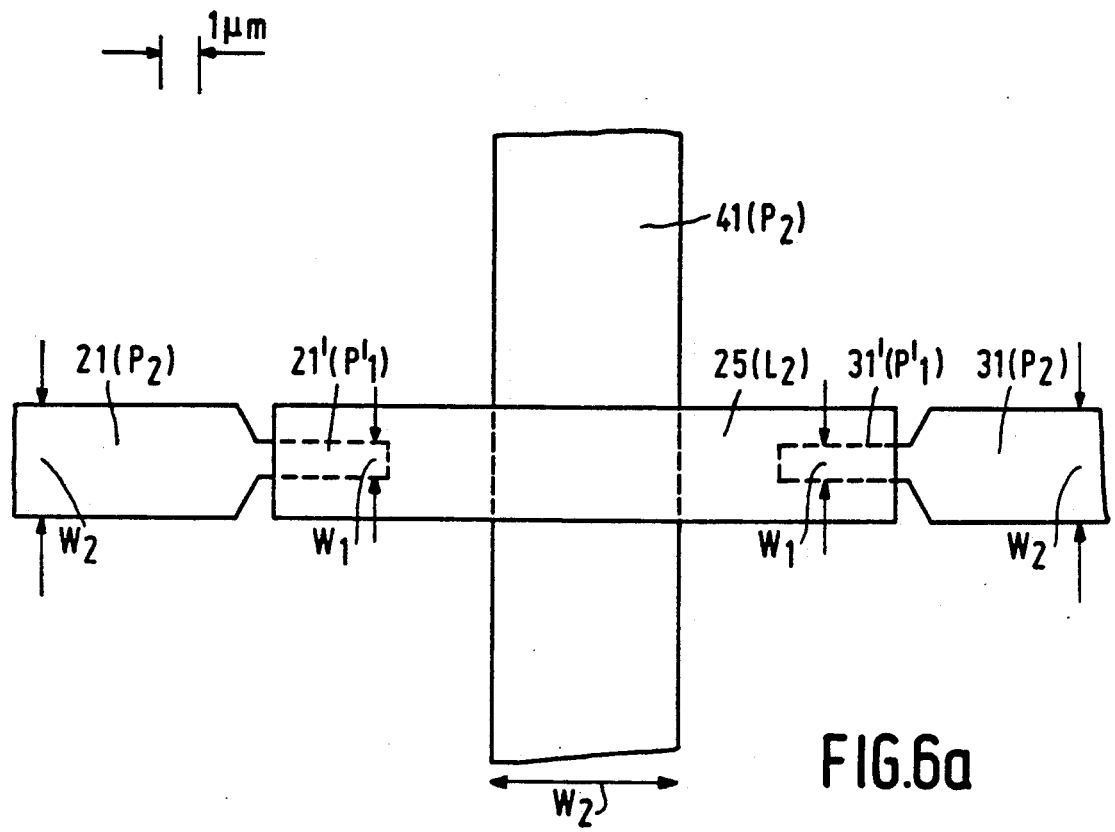
FIGS. 6a and 6b show in plan view examples of interconnections between various parts of integrated circuits obtained by means of the method according to the invention.
Figure 6B:
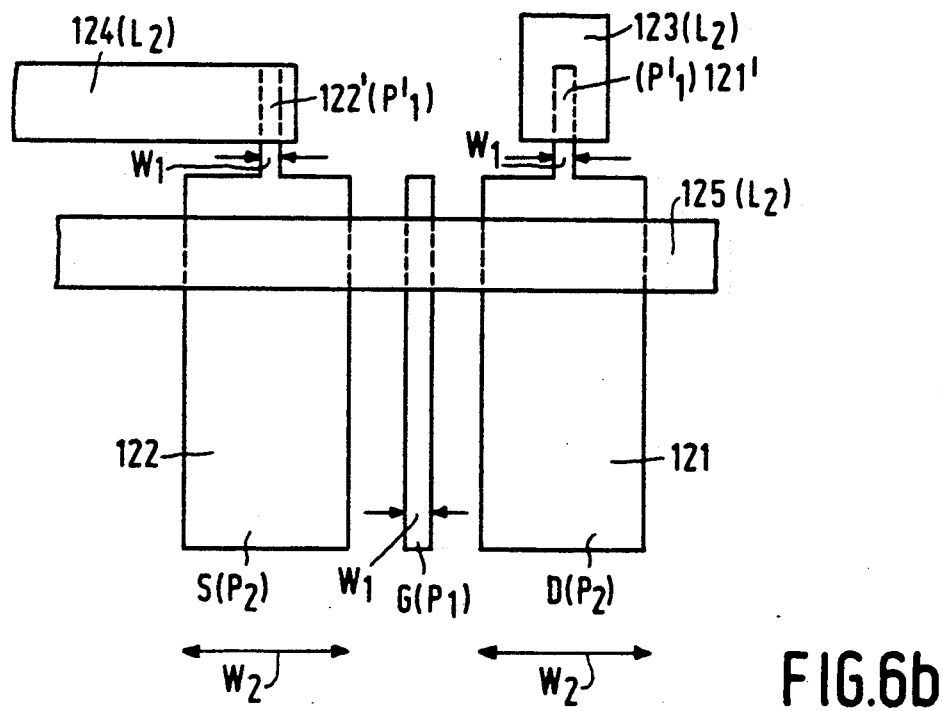

If at this first level $N_1$, elements, such as interconnection lines 21 or 31, as shown in FIG. 6a, are situated, which by their dimensions are not in the category of the first parts $P_1$, because such parts already exist, smaller than those shown on which VIAs are provided, it is then sufficient to provide on these lines or in part of these elements a part of reduced width, such as an appendix $P'_1$, 21' and 31', respectively, having suitable dimensions $W_1$ so that the region of the part of reduced width or of the appendix $P'_1$ is caused to enter the category of the first patterns $P_1$. In the later steps of the method, the region of the part of reduced width or of the appendix will automatically be the region of location of the desired VIA.

Thus, a part of reduced width of an appendix $P'_1$ can be readily formed on interconnection lines (see FIG. 6a), but also an appendix $P'_1$ can be readily provided at the end of an electrode 121 or 122 of, for example, a transistor. Thus, FIG. 6b shows the appendices $P'_1$ and 121' and 122', respectively, at the ends of the source and drain electrodes S and D, respectively, of a field effect transistor, whose gate G constitutes a part $P_1$.

Therefore, according to the invention, instead of providing widened parts to obtain VIAs, most frequently parts of reduced width will be provided in regions designated by $R_1$ or interconnection regions for the parts $P_2$. This results in a quite new way of working for the designer of integrated circuits.

Figure 4A:
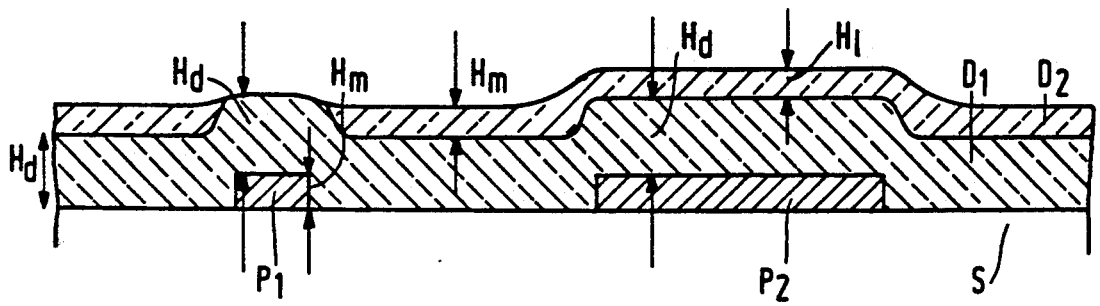
FIGS. 4a and 4b show the heights of the layers used in the steps leading to the second variation of the invention.
Figure 4B:
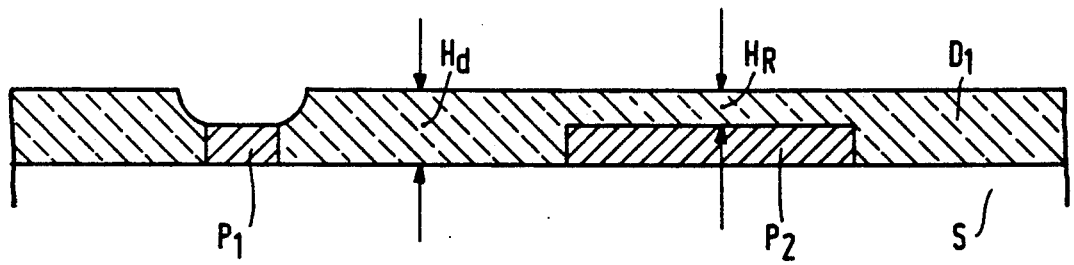
Figure 4C:
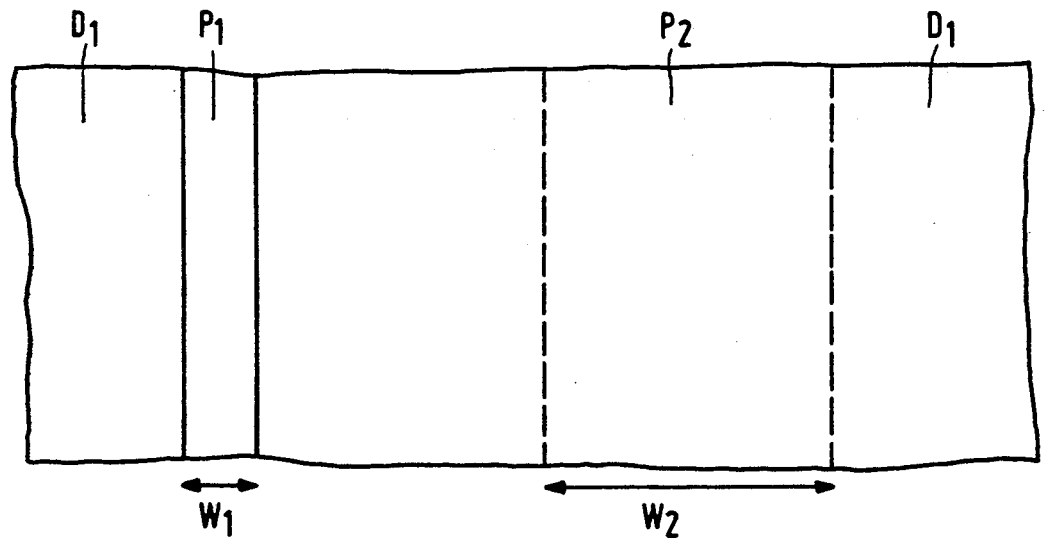
FIG. 4c is a plan view of FIG. 4b and illustrates that the whole surface of the parts $P_1$ can be exposed at this stage of the method.
Figure 5A:
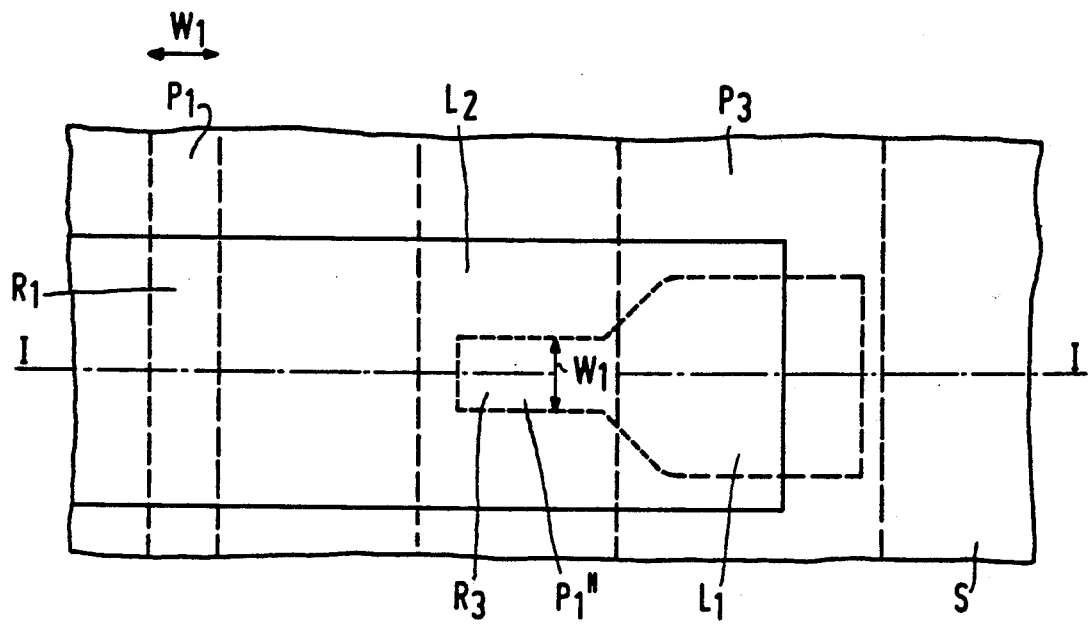
FIG. 5a is a plan view of an interconnection between a first part $P_1$ disposed at a first level of the circuit and a third part $P_3$ disposed at a second level of the circuit lower than the first level obtained by means of the method according to the invention.

It should be noted that the opening will be provided in the whole region in the category $P_1$, for example the whole upper surface of the gate G of a field effect transistor (see FIG. 6b) or the whole upper surface of the line part of reduced width 21', 31', 121', 131' (see FIGS. 6a, 6b and FIG. 4c). Thus, the whole part $P_1$ is a possible interconnection region designated by $R_1$ as shown in FIG. 5A.

This results in one of the advantages of the invention, which consists of a substantial saving in surface area, especially for the first layers of the integrated circuit. These layers are generally also the densest layers and determine the final dimension of the substrate to be used and new facilities for the designer of integrated circuits in providing the location of the second patterns $L_2$.

Figure 1B:
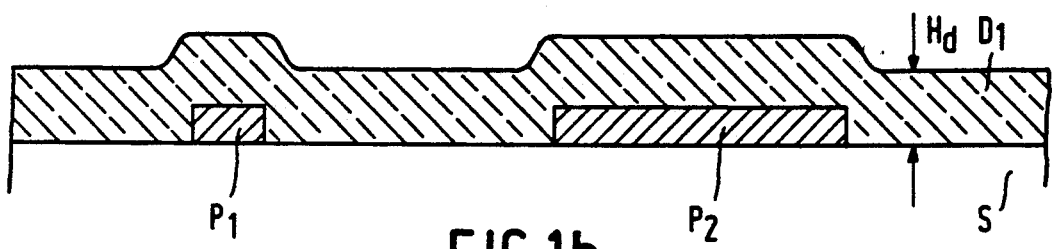

Next is the step (B) Deposition, as illustrated in FIG. 1b, of a uniform layer of a first kind of dielectric $D_1$. In order to obtain this uniform layer, the dielectric $D_1$ must be chosen among the materials which are deposited by a growing method, for example by a chemical action in the vapour phase known under the designation of CVD or PECVD, or by cathode sputtering. The term "uniform layers" is to be understood to mean that the thickness $H_d$ of the dielectric $D_1$ is the same on the first parts $P_1$, on the second parts $P_2$ and between the parts $P_1$ and $P_2$. On the other hand, the thickness of this dielectric layer $D_1$ will be chosen to be:

$H_d \geq H_m$ $H_m$ being the height of the first parts $P_1$ with respect to the level $N_1$, which essentially has for its object to cover entirely all the patterns of this first level $N_1$.

However, the thickness of the dielectric $D_1$ in this step depends upon the object that should be attained subsequently.

Figure 2A:
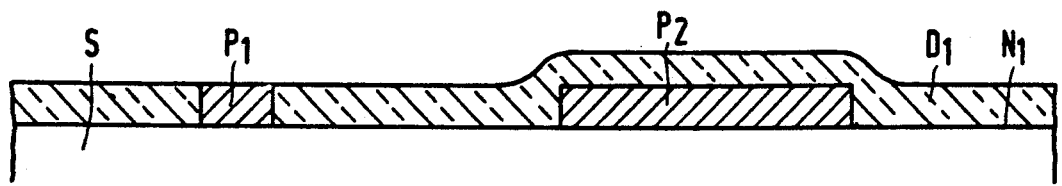
FIGS. 2a and 2b show the following steps of the method in a first variation where the first patterns comprise coplanar parts $P_1$ and $P_2$.
Figure 3A:
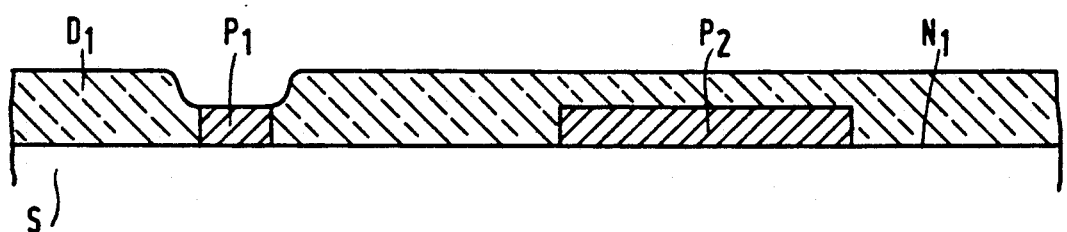
FIGS. 3a and 3b show the following steps of the method in a second variation and in the case in which the first pattern comprise coplanar parts $P_1$ and $P_2$.

In fact, according to the invention, the method can be carried out in two variations. The first of these variations permits obtaining a local planarization around the first parts $P_1$ with the second parts $P_2$ nevertheless remaining covered by the dielectric layer $D_1$ forming a MESA on these parts $P_2$, as shown in FIG. 2a. The second of these variations permits obtaining a general planarization of the device, the second parts $P_2$ being covered by the dielectric $D_1$ and windows being opened above the first parts $P_1$. These windows have the form of a basin of small depth, whose bottom is constituted by the surface of these first parts $P_1$, as shown in FIG. 3a. If the second variation is chosen, during this step of forming the dielectric layer $D_1$ a thickness $$H_d = H_m^2 (H_m - H_l)^{-1}$$

of this material must be deposited.

In this relation, $H_l$ is the difference in thickness which will be obtained during the following step (C) between the first thickness of a second layer of dielectric $D_2$ above the first parts $P_1$ and the second thickness of the second layer $D_2$ above the second parts $P_2$ to carry out the second variation of the invention.

The value of $H_l$ can be found either by experiments or by modelling and is of the form:

$$H_l = k.H_m^2(W_2 - W_1)(W_1 + H_m)^{-1}(W_2 + H_m)^{-1}.$$

Materials particularly suitable to obtain the layer $D_1$ can be chosen among silica ($SiO_2$) or silicon nitride ($Si_3N_4$), which are isolators very frequently used in integrated circuit technology. As the layer $D_1$ is an ultimate layer, it is absolutely necessary that this dielectric has a recognized quality.

Figure 1C:
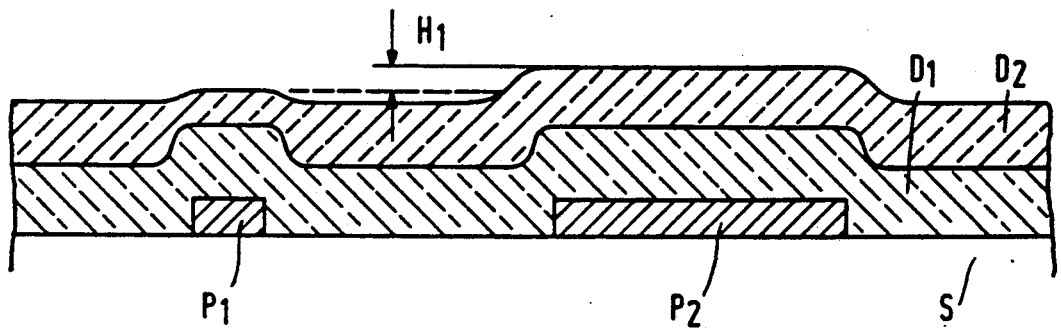

The next step is (C) Formation of a second dielectric layer $D_2$, as shown in FIG. 1c. This dielectric layer $D_2$ must be chosen among the materials extending in the fluid form, which permits obtaining a first thickness on the first parts $P_1$ and a second thickness on the second parts $P_2$. The second thickness on the second parts will be especially larger than the first thickness on the first parts $P_1$. The difference between these thicknesses will be $H_l$, whose formula has been given above. There will be a so-called third thickness also larger than the first thickness between the patterns if they are mutually separated. In the equation for $H_l$, k is a constant which depends upon the material chosen to obtain this second dielectric layer $D_2$. In order to obtain the second dielectric layer $D_2$ extending in fluid form, polymerisable resins, such as an epoxy resin or further a photosensitive lacquer, can be chosen of which here the properties known for the photolithography will not be utilized, but only the fact that the photosensitive lacquers are deposited in a smaller thickness on small patterns than on large patterns, when they are deposited in certain conditions, is utilized.

When considering the distribution of the thicknesses of such a layer $D_2$ as a function of the dimensions W of the different patterns, it is found that the thicknesses increase according as to increase in the dimensions W of the patterns, when the layer $D_2$ is deposited under the conditions defined below. Therefore, in order to achieve the object of the invention and to clearly distinguish the thicknesses of dielectric $D_2$ formed on the different parts of the patterns, it is necessary that these parts have greatly different dimensions. These differences in dimensions will be sufficient when $W_2$ is larger than or approximately equal to twice $W_1$.

This distinction can be readily made in integrated circuits due to the fact that in the original design there are elements or parts of patterns having greatly different dimensions or due to the fact that a part of reduced width or an appendix $P'_1$ can always be provided at the location at which a VIA should be opened.

For example, in order to obtain the dielectric layer $D_2$, a positive photosensitive lacquer AZ 4110 (Shipley Society) may be chosen, which is deposited under the following conditions:

speed of rotation 4500 revolutions/min for a duration of 40 seconds;

drying of the lacquer at a temperature of 90° C. for 30 minutes exposure to ultraviolet radiation having a wavelength of 300 nm with an energy of 900 mJ/cm²; and successive annealings at 90° C., 120° C., 180° C. and In the case in which this photosensitive lacquer is used on a layer of silica ($SiO_2$), the coefficient k in the equation for $H_l$ is of the order of $\frac{1}{2}$.

The total planarization of the device by means of this layer $D_2$ is not required, which could also be obtained in other deposition conditions.

A further step is (D) Carrying out a first step of dry etching, for example of by reactive ion etching, to etch the second dielectric layer $D_2$ at a uniform rate. This first step of dry etching will be stopped as soon as zones of the first dielectric layer $D_1$ will appear at the surface of the device. Methods are known to those skilled in the art for obtaining automatic stopping of the etching treatment.

If the positive photosensitive lacquer mentioned above has been used, a uniform etching of this lacquer will be obtained by means of $O_2$ gas mixed with the vectorial gas $N_2$ at an etching rate of the order of 145 nm/min. A uniformity of the order of $\pm 1\%$ is aimed at.

Figure 1D:
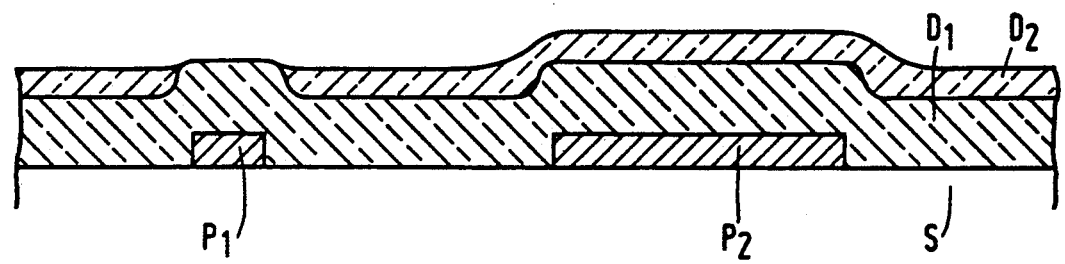

Beyond this step, the etching conditions will be different depending upon whether one or the other of the variations of the invention are to be used. At the end of step (D), the device as shown in FIG. 1d in sectional view or in FIG. 4a in sectional view has a layer of dielectric $D_1$ still unattacked, covered by a thickness $H_l$ of the layer of dielectric $D_2$ above the parts $P_2$. Above the first parts $P_1$, this thickness is zero, the layer of dielectric $D_1$ then being level with the surface.

From this device a second step of dry etching or reactive ion etching can be started, which second step can be carried out in two different ways, leading to the two variations of the device according to the invention.

The first variation is obtained after step $E_1$ and the second variation is obtained after step $E_2$ both described below. The choice between the first and the second variation is made as a function of the residual thicknesses $H_R$ of dielectric $D_1$ that the designer of integrated circuits wants to maintain at the surface of the second parts $P_2$ having large dimensions.

In fact, for example, the parasitic capacitances that can be introduced into the circuit between the parts $P_2$ on the first level $N_1$ and the metallic patterns situated at a higher level, i.e. at the surface of the dielectric $D_1$ at the end of the method according to the invention (see FIG. 2b and 3b) depend upon the thickness $H_R$ of the residual dielectric $D_1$ maintained at the surface of the parts $P_2$.

In the following steps of the method according to the invention leading to the first variation, there is thus the step of:

($E_1$) carrying out a so-called second step of dry etching, for example reactive ion etching, at a rate of etching the second layer $D_2$ equal to the rate of etching the first layer $D_1$. This etching is stopped upon the appearance of the upper surface of the first parts $P_1$. A layer of the first dielectric $D_1$ remains at the surface of the second parts $P_2$ forming a MESA, both in the case in which the first parts $P_1$ have the same height $H_m$ as the second parts $P_2$ and in the case in which the height $H_m$ of the first parts $P_1$ is larger than that of the second parts $P_2$. The openings formed at the surface of the first parts $P_1$ are then particularly suitable to constitute VIAs. The layer $D_2$ has been completely eliminated. As already stated above, those skilled in the art will employ, one of the methods known from the prior art for attaining the automatic stopping of the etching treatment.

The etching selectivity S defined as the ratio between the rate of etching layer $D_1$ and the rate of etching layer $D_2$ must therefore be equal to 1.

In order to obtain this selectivity $S=1$, in the case given by way of example in which the layer of the second dielectric $D_2$ is made of the photosensitive lacquer mentioned above, and in which the layer of the first dielectric $D_1$ is made of silica ($SiO_2$), the method according to the invention can be carried out by means of gases:

$SF_6$ with a flow rate of 2.14 SCCM,
$CHF_3$ with a flow rate of 14.3 SCCM,
$N_2$ with a flow rate of 19.3 SCCM.

The etching rates obtained by this system are of the order of 30.5 nm/min for the first dielectric $D_1$ and of 31 nm/min for the second dielectric $D_2$.

For first parts $P_1$, whose height is:
$H_m \simeq 0.5$ μm
and the smallest lateral dimension, i.e. measured parallel to the plane of the first level $N_1$, is:
$W_1 \simeq 0.8$ μm,
and for parts $P_2$ of the same height and having lateral dimensions measured in the same plane:
$W_2 \simeq 5$ μm,
these patterns being, as the case may be, mutually separated by a distance:
$L \simeq 5$ μm;
the residual thickness of the dielectric $D_1$ is equal to the difference $H_l$ of the dielectric $D_2$, which originally between the parts $P_2$ and $P_1$, i.e.
$H_R \simeq H_l \simeq 0.25$ μm.

The second variation of the device according to the invention is obtained after the following step:

($E_2$) carrying out a so-called second step of dry etching, for example reactive ion etching, at a rate of etching the first dielectric $D_1$ higher than the rate of etching the second dielectric $D_2$. Under this condition, the first dielectric $D_1$ is attacked in the openings in the second dielectric $D_2$ above the first parts $P_1$. Due to the fact that the first dielectric $D_1$ is etched at a rate higher than that of the second dielectric $D_2$, basins are obtained above the parts $P_1$ and have edges of a cavity turned toward the exterior of the device and having a small depth. The etching is stopped as soon as the upper surface of the first parts $P_1$ appears in these basins, while carrying out a known method of stopping the etching treatment.

The advantage of this variation is that, by correctly choosing the selectivity S of etching the electric layers $D_1$ and $D_2$, a fully planar device can be obtained, which only has openings in the form of basins at surface of the parts $P_1$, these openings being particularly suitable to form VIAs.

If the dimensions and materials of the embodiment described above are maintained, i.e.:
$H_m \simeq 0.5$ μm,
$W_1 \simeq 0.8$ μm,
$W_2 \simeq 5$ μm,
$L \simeq 5$ μm, as the case may be,
$H_l \simeq 0.25$ μm,
in order to obtain the planarization of the device under the conditions shown in FIGS. 3a and 3b, the thickness of the deposited dielectric $D_1$ must be:
$H_d \simeq H_m^2 (H_m - H_l)^{-1}$
and the selectivity:
$S \simeq (H_d - H_m) H_l^{-1}$.

When choosing
$H_d \simeq 1$ μm,
this results, in order to obtain a planar device, in etching conditions leading to
$S = 2$.

For dielectric layers $D_1$ and $D_2$ constituted respectively by silica ($SiO_2$) and positive photosensitive lacquer, mentioned above, these etching conditions are obtained with reactive ion etching by means of the gases:

$SF_6$ with a flow rate of 1.9 SCCM
$CHF_3$ with a flow rate of 24.5 SCCM
$N_2$ with a flow rate of 9.3 SCCM
at a high pressure and power.

The etching rates are then of the order of 23.5 nm/min in the second dielectric $D_2$ (positive photosensitive lacquer) and of 45.0 nm/min in the first dielectric $D_1$ ($SiO_2$).

Figure 5B:
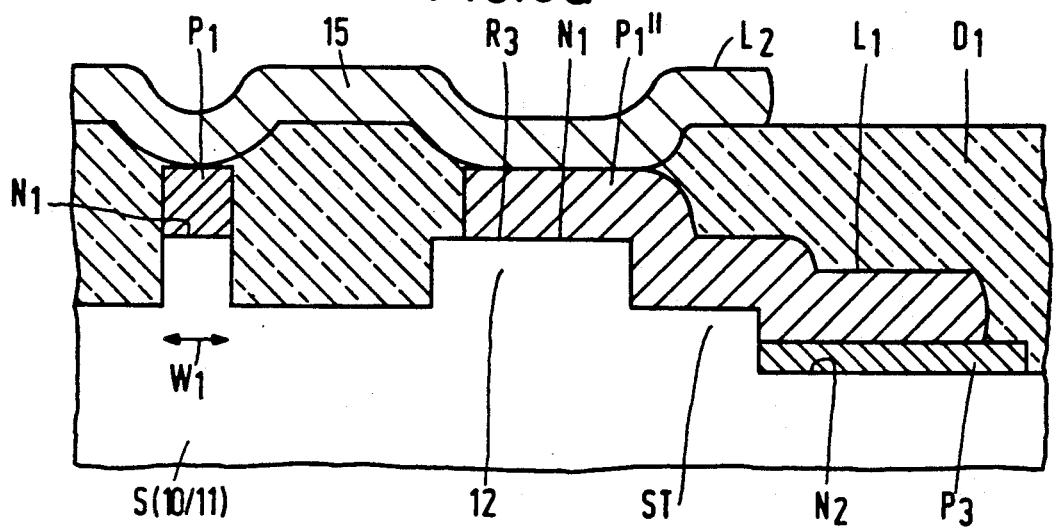
FIGS. 5b and 5c show in sectional view such an interconnection, where

The residual thickness $H_R$ of the first dielectric $D_1$ on the second parts $P_2$ is in this case of the order of 0.45 μm (see FIG. 5b).

The preceding steps $E_1$ and $E_2$ of the manufacturing method according to the invention may also be carried out if the first dielectric $D_1$ is different, for example silicon nitride ($Si_3N_4$). In the case of step $E_2$, a selectivity S will be chosen which is higher than for silica ($SiO_2$), for example $S = 3$ or 4.

As is apparent from FIGS. 4a and 4b showing the thicknesses used during the steps D and $E_2$ in the case in which $S=2$, at the end of the step $E_2$ the thickness of the residual thickness of the dielectric $D_2$ above the second parts $P_2$ depends only upon the initial thickness $H_m$ of the first parts $P_1$ and upon the thickness $H_d$ of the dielectric $D_1$;
$H_R \geq H_d - H_m$.

On the other hand, no second dielectric $D_2$ is left at the end of the process.

It should further be noted that for the gases used for the second dry etching step the first dielectric layer $D_1$ must be etched selectively so as to readily permit stopping the process as soon as the upper surface of the first parts $P_1$ appears.

Figure 2B:
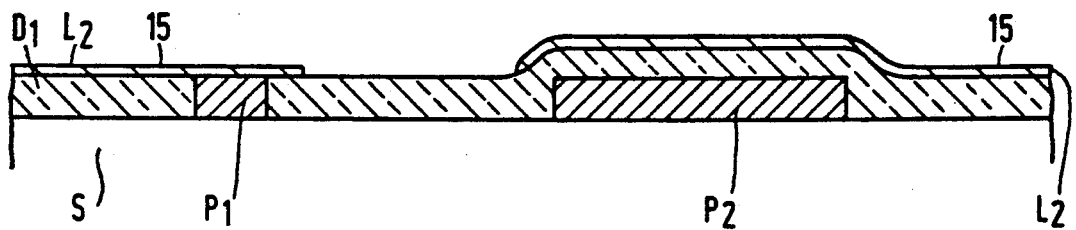
Figure 3B:
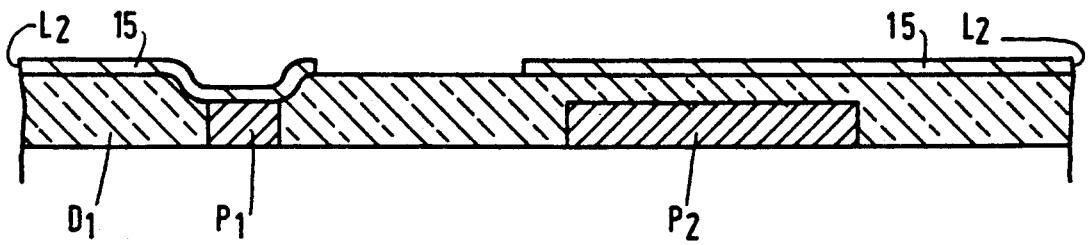

In order to obtain the interconnection between the first parts $P_1$ on the first level $N_1$ and the patterns $L_2$ situated at a higher level of the circuit, a step can then be carried out of:

(F) forming a mask on the second interconnection level and depositing a metallic layer 15 in the openings of this mask (see FIGS. 2b and 3b). This deposition can take place, for example, by evaporation, by cathode sputtering, or by electrolytic growth by means of metals chosen among the metals apt to form the first patterns of the first level and with thicknesses that can vary from a few tens of nms to a few microns. The patterns $L_2$ of this metallic layer 15 of a higher level are arranged so as to present regions situated at the surface of the opened VIAs during steps $E_1/$ and $E_2/$, thus establishing the electrical contact between metals at $N_1$ and the higher level otherwise isolated by the residual thickness of the dielectric layer $D_1$ or connecting by conductive lines $L_2$ parts $P_1$ and $P'_1$ to each other.

FIGS. 6a and 6b show in plan view different devices obtained by the use of the method according to the invention.

FIG. 6a shows interconnection between lines. The parts $P_2$ are shown here by the lines 21 and 31 formed at a first level $N_1$ and by the line 41 also situated at this first level. FIG. 6a is a simplified representation of the device, but it is shown on the scale of a possible example of application of the method according to the invention. The distance corresponding to 1 $\mu$m is represented in this FIG. 6a. In this example, the lines 21 and 31 should be interconnected by a line 25 formed at a higher level. In order to apply the method according to the invention, because lines 21, 31 and 41 have transverse dimensions which are approximately equivalent and indicated as $W_2$, during formation of the lines 21 and 31 appendices $P'_1$, 21' and 31' are provided at the end of these lines with a dimension $W_1$ to be assimilated to parts $P_1$. When carrying out the method according to the invention, VIAs are automatically opened in these parts of reduced width 21' and 31' and the line 25 ($L_2$) can then be formed in the metallic layer 15 at a higher level with a signal mask due to the fact that a mask for opening VIAs is not necessary.

FIG. 6b shows diagrammatically in plan view and not to scale an interconnection line 125 ($L_2$) at a higher level formed above a VIA opened by the method according to the invention in the gate G formed by a part of the $P_1$ type, for example of submicron dimensions of the order of $W_1 = 0.25$ $\mu$m for a field effect transistor, in which S and D are the source and the drain, respectively. The electrodes S, G and D are formed at the first level $N_1$ and S and D have dimensions $W_2$ considerably larger than G, for example 5 to 8 $\mu$m, and are formed by the second parts $P_2$. The electrodes S and D are moreover spaced from G by a distance L of the order of 1 to 2 $\mu$m, i.e. of the order of twice the transverse dimension $W_1$ of the gate G. According to the invention, the interconnection line $L_2$ 125 can be connected directly to the gate G above the gate finger without it being necessary to provide at one end of the finger a pad of large surface area for opening the VIA, as is known from the state of the art. This interconnection line 125 may also be arranged at any area of the gate G because the whole surface of the latter is exposed by this method. This results in a design facility for the designer of integrated circuits. According to the invention the interconnection is formed between G and the line 125 with a substantial saving in space. Thus, several gate fingers can be connected in the case of interdigitated transistors.

It is clear that the method according to the invention can be used also to interconnect, for example, the emitters of bipolar transistors (not shown). In fact, the upper surface of these electrodes is slightly higher than the upper surface of the base and the collector of the same transistor. Consequently, the height $H_m$ of the emitter considered as the first part $P_1$ is larger than that of the base and of the collector considered as third parts $P_3$. Moreover, the dimensions of the emitter of the order of 1 to 2 $\mu$m are very suitable for use in the invention, in view of the dimensions of the base and of the collector, which are the order of 3 to 4 $\mu$m. Here the use of the invention is of particular importance to obtain a residual thickness $H_R$ of dielectric above the base and the collector sufficient for their isolation. Openings in these electrodes can then be formed by a method which will be described hereinafter.

With regard to a planar transistor of the kind shown in FIG. 6b, in which the three electrodes S, G and D have approximately the same height $H_m$, but not all have dimensions for the first parts $P_1$, it is sufficient to provide at the level of the other electrodes S and D 122 and 121, respectively, an appendix 122' and 121' of small dimension $W_1$, to which a VIA will be opened automatically by the use of the method according to the invention, such as for example, by the use of the second variation (step $E_2$, see FIG. 6b). All the connections can then be formed during the same steps ($E_2+F$), for example by means of the line 124 ($L_2$) on the part 122' and by means of the line 123 ($L_2$) on the part 121'. The lines 124 and 123 are constituted, for example, by the layer 15.

The applications of the invention in the field of integrated circuits are therefore numerous because a part of reduced width $P'_1$ can be, provided with a metallic part at the first level $N_1$, on which a VIA should be opened, even where this part has not the dimensions desired to enter the category of the conditions imposed on the dimensions of the first parts $P_1$.

The method according to the invention may also be used in the formation of interconnections between parts of patterns arranged at the first level $N_1$ and other parts arranged at a lower second level $N_2$, in the formation of integrated circuits, especially micron or submicron circuits, which are non-planar.

The different patterns are metallic or semiconducting. In this example, they are metallic.

Figure 5C:
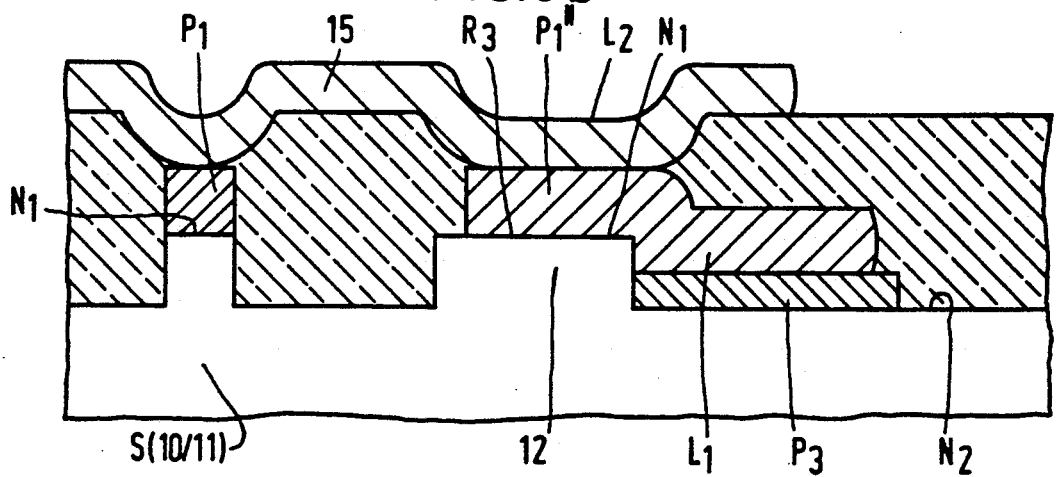

As shown in FIG. 5a in plan view and in FIGS. 5b and 5c in sectional view, as well as in FIG. 1a in sectional view, the first parts $P_1$ are present at the first level $N_1$, which have at least one small dimension $W_1$ measured parallel to the level $N_1$, and the second parts $P_2$ of larger dimension $W_2$ are also present at this level. At the a second lower level $N_2$ so-called third parts $P_3$ of arbitrary dimensions are present.

The object of this method is to form interconnections between the parts $P_3$ and $P_1$ of a nonplanar circuit, to protect the circuit by a dielectric layer of high quality $D_1$, to form openings at the surface of the first parts $P_1$, and to form interconnection lines $L_2$ with the other patterns at the surface of the dielectric layer $D_1$ to connect to other parts $P_1$ or to parts equivalent to $P_1$. This dielectric layer $D_1$ is preferably both planar and unexposed at the patterns $P_2$ during the operation of providing openings in the patterns $P_1$. This operation is carried out without using a conventional mask, which is provided and positioned only with difficulty so that the cost required for this is high.

For this a embodiment, the method according to the invention first comprises step (A) already described above. However, in this step, simultaneously with the step of defining the design of the parts $P_1$ and $P_2$, locations or interconnection regions $R_3$ for the patterns $P_3$ are defined (see also FIGS. 5) and parts $P_1$ of metallic or semiconducting patterns are formed at the second level $N_2$ of the integrated circuit, as shown in sectional view in FIGS. 5b and 5c, or in plan view in FIG. 5a. FIG. 5c is a sectional view taken on the axis I—I of FIG. 5a.

These parts $P_3$ are not only formed at a lower level $N_2$ of the circuit, but also their upper surface is arranged in a plane lower than the upper surface of the parts $P_1$ so that a planar interconnection between the parts $P_1$ and $P_3$ is not possible.

The first level $N_1$ can be the upper surface of a stack 11 of semiconductor layers of different materials or of different conductivity types formed on a substrate 10 of a semiconductor material, such as silicon or gallium arsenide or another material of the group III-V. In the whole following description, these support layers will be designated by S for the sake of simplicity of writing.

The level $N_2$ can be constituted by one of the different layers of the stack 11, which forms the level $N_1$. The parts $P_3$ can be formed by any means known to those skilled in the art. For example, the substrate 10 or the stack 11 may be etched down to the level $N_2$ in the opening of a mask or by self-alignment on other patterns. Subsequently, the parts $P_3$ are formed at the level $N_2$ by means of one of the materials previously mentioned for formation of the parts $P_1$ and $P_2$.

The dimensions of the parts $P_3$ may be arbitrary. The parts $P_3$ may be, for example, collector or base electrodes of bipolar hetero-junction transistors (HBT), and the parts Pthen are either emitter electrodes of such transistors or connection lines of the first level $N_1$. The parts $P_3$ may also be gates of buried gate field effect transistors.

A problem then arises for using the invention as described above due to the difference in height between the upper surfaces of the parts $P_3$ and of the parts $P_1$, which difference is generally due to the difference between the levels $N_1$ and $N_2$.

Therefore, there is preferably interposed between the step A described above and step B above the additional step of:

(A') forming, as the case may be, a step ST between the third part $P_3$ and its respective interconnection region $R_3$ of the first level or substantially of the first level $N_1$ (cf. FIG. 5b).

The upper surface of the step ST is at an intermediate level between the level $N_1$ and the level $N_2$. More than one step can be provided if the difference in height between the level $N_1$ and the level $N_2$ is great.

If the part $P_3$ to be interconnected is the collector of a transistor HBT, the upper level of the step ST can be that of the base of the transistor and the step can be provided by etching jointly with the formation of this base (see FIG. 5b).

If the part $P_3$ to be interconnected is the base of a transistor HBT, the problem of the formation of the step ST can be avoided (see FIG. 5c).

Irrespective of whether the (one or several steps) ST prove to be necessary or not necessary, it may otherwise be necessary for maintaining an interconnection region $R_3$ at the level $N_1$ or substantially at the level $N_1$ for the pattern $P_3$ to form a pad 12, with an upper surface substantially at the level $N_1$ (see FIGS. 5b and 5c). This pad 12 is formed by an arbitrary etching method adapted to the material of 10 or 11.

Otherwise, if the difference between the level $N_1$ and the level $N_2$ is small, a simple inclination obtained by etching can be sufficient to permit the following step, which is interposed between the step A' and the step B, i.e.

(A") Forming a first conducting line $L_1$ connecting the third part $P_3$ to its interconnection region $R_3$. The steps ST are provided when the difference in level between $N_1$ and $N_2$ is great and would involve the risk of creating faults in the line $L_1$. Therefore, the person skilled in the art would provide such a number of steps as is necessary. However, it is preferable, in order not to lengthen the process to carry out the formation of the steps, jointly with the formation of other levels indispensable for forming the non-planar circuit.

During its manufacture, the first conducting line $L_1$ is formed with a design according to which it comprises in the interconnection region $R_3$, for example, a part having a reduced width or an appendix $P''_1$ (13) (see FIGS. 5) having at least a transverse dimension $W_1$ suitable to permit its classification in the category of the first patterns $P_1$.

This conducting line $L_1$ may be made of any material conventionally employed in integrated circuit technology for forming interconnection lines. This material may be deposited in the opening of a mask by a conventional method known to those skilled in the art.

At this stage of the method, reference is made to the step B described above. However, each time reference is made to a part $P_1$, also the parts $P'_1$ and $P''_1$, which have the same properties, are included.

On the other hand, when carrying out the method, in general and more particularly in the case of non-planar circuits the variation is preferred which results in the planarization of the first dielectric layer $D_1$ and hence of the device as a whole.

Thus, according to the method, due to the upper metallic layer 15, interconnections $L_2$ can be formed between the parts $P_1$ or $P'_1$ or $P''_1$ in interconnection regions chosen as favourable regions, $R_1$, $R_2$ and $R_3$, respectively. Further, since the surface of the remaining dielectric layer $D_1$ may be planar, at its surface, besides the layer 15, any kind of patterns other than interconnection lines may be formed in such a manner that the method according to the invention can be repeated several times.

I claim:

1. A method of manufacturing integrated circuits having improved electrical and mechanical properties comprising the steps of
    (a) forming first conducting patterns on a substrate, said first conducting patterns including at least one first conducting portion having a dimension $W_1$ and at least one second conducting portion having a dimension $W_2$ substantially larger than $W_1$, said first conducting portion and second conducting portion having substantially coplanar upper surfaces;
    (b) at least some of said second conducting portions being formed with appendices of reduced width, said appendices having a dimension substantially equal to $W_1$, and said appendices having an upper surface substantially coplanar with the upper surfaces of said first conducting portions;
    (c) depositing a first dielectric layer over said conducting patterns and said substrate, said first dielectric layer being a passivating material, and said first dielectric layer having a uniform thickness, said uniform thickness being at least equal to a thickness of said at least one first conducting portion;

(d) thereafter depositing a second dielectric layer over said first dielectric layer, said second dielectric layer also being passivating and having a smaller thickness over said at least one first conducting portion than over said at least one second conducting portion;

(e) etching said second dielectric layer until said first dielectric layer over said at least one first conducting portion appears;

(f) thereafter etching said first dielectric layer at an etch rate greater than the etch rate of said second dielectric layer to form openings to said first conducting portions while said second conducting portions remain covered by a thickness of said first dielectric layer; and (g) thereafter depositing metallic conduction layers in contact with said first conduction portions through said openings, said metallic conduction layers being separated from said second conducting portions.

2. A method according to claim 1, wherein during forming said first conducting portions in carrying out step (a), third conducting portions are formed on said substrate at a level below said first and second conducting portions, said third conducting portions having arbitrary dimensions and having upper surfaces at a level lower than said upper surfaces of said first conducting portions, and wherein conducting lines are formed in contact at one end to said third conducting portions and at a second end to contact levels including at least one of said appendices, said conducting lines at said contact levels having upper surfaces substantially coplanar to said upper surfaces of said first conducting portions.

3. A method according to claim 2, wherein said level of said third conducting portions is formed sufficiently below said first and second conducting portions to require at least one step between said third conducting portions and said contact levels.

4. A method according to claim 2, wherein said uniform thickness Hd of said first dielectric layer is selected as a function of heights Hm of said first conductive portions and of the difference Hl between the thicknesses of said second dielectric layer by the relation $$Hd = Hm^2(Hm - Hl)^{-1}$$

and wherein a ratio s between said rate of etching said first dielectric layer and said rate of etching said second dielectric layer in said step (f) satisfies the condition $$s = (Hd - Hm)Hl^{-1} > 1.$$

5. A method according to claim 2, wherein said dimension $W_1$ is less than or equal to $W_2/2$, where $W_2$ is a smallest of dimensions of said second conducting portions.

6. A method according to claim 2, wherein upon said step (f) being carried out to form said openings, then second conducting patterns are formed for interconnecting some of said first conducting patterns, said second conducting patterns having contact zones for said first conducting portions and said appendices at said conducting lines.

7. A method according to claim 6, wherein said steps (a) through (g) are repeated at least one.

8. A method according to claim 1, wherein said first dielectric layer is formed from one of silica ($SiO_2$) or silicon nitride ($Si_3N_4$), and wherein said second dielectric layer is formed from polyimide or photoresist.

9. A method according to claim 1, wherein said first conducting portions include micron patterns, said second conducting portions include electrodes of active elements or interconnection lines, and wherein said third conducting portions include electrodes of active non-planar elements.

10. A method according to claim 9, wherein said micron patterns include gates of field effect transistors or emitters of bipolar transistors, and wherein said active non-planar elements include bases or collectors of bipolar transistors.

11. A method according to claim 1, wherein said uniform thickness Hd of said first dielectric layer is selected as a function of heights Hm of said first conductive portions and of the difference Hl between the thicknesses of said second dielectric layer by the relation $$Hd = Hm^2(Hm - Hl)^{-1}$$

and wherein a ration s between said rate of etching said first dielectric layer and said rate of etching said second dielectric layer in said step (f) satisfies the condition $$s = (Hd - Hm)Hl^{-1} > 1.$$

12. A method according to claim 1, wherein said dimension $W_1$ is less than or equal to $W_2/2$, where $W_2$ is a smallest of dimensions of said second conducting portions.

13. A method according to claim 1, wherein upon said step (f) being carried out to form said openings, then second conducting patterns are formed for interconnecting some of said first conducting patterns, said second conducting patterns having contact zones for said first conducting portions and said appendices at said conducting lines.

14. A method according to claim 13, wherein said steps (a) through (g) are repeated at least one.

* * * * *